US011011630B2

(12) United States Patent
Yamamoto et al.

(10) Patent No.: US 11,011,630 B2
(45) Date of Patent: May 18, 2021

(54) SEMICONDUCTOR WAFER

(71) Applicant: SUMITOMO CHEMICAL COMPANY, LIMITED, Tokyo (JP)

(72) Inventors: Taiki Yamamoto, Tsukuba (JP); Takenori Osada, Hitachi (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 0 days.

(21) Appl. No.: 16/425,516

(22) Filed: May 29, 2019

(65) Prior Publication Data
US 2019/0296136 A1 Sep. 26, 2019

Related U.S. Application Data

(63) Continuation of application No. PCT/JP2017/042919, filed on Nov. 29, 2017.

(30) Foreign Application Priority Data

Nov. 30, 2016 (JP) .............................. JP2016-231902

(51) Int. Cl.
*H01L 29/778* (2006.01)
*H01L 29/267* (2006.01)
(Continued)

(52) U.S. Cl.
CPC ............ *H01L 29/778* (2013.01); *C23C 16/34* (2013.01); *C23C 16/42* (2013.01); *H01L 21/205* (2013.01); *H01L 29/267* (2013.01); *H01L 29/812* (2013.01)

(58) Field of Classification Search
CPC ... H01L 29/778; H01L 21/205; H01L 29/267; H01L 29/812; H01L 21/02488;
(Continued)

(56) References Cited

U.S. PATENT DOCUMENTS 8,148,753 B2  4/2012  Oishi et al.
8,853,828 B2  10/2014  Sumiya et al.
(Continued)

FOREIGN PATENT DOCUMENTS

JP  2006-310688 A  11/2006
JP  2008-171843 A   7/2008
(Continued)

OTHER PUBLICATIONS

Wang et al., Interfacial reaction control and its mechanism of AlN epitaxial films grown on Si(111) substrates by pulsed laser deposition; Scientific Reports, 5.11480 (Year: 2015).*
(Continued)

*Primary Examiner* — Syed I Gheyas
(74) *Attorney, Agent, or Firm* — Birch, Stewart, Kolasch & Birch, LLP

(57) ABSTRACT

A semiconductor wafer is provided, which has a silicon wafer, a reaction suppressing layer, a stress generating layer and an active layer, the silicon wafer, the reaction suppressing layer, the stress generating layer and the active layer being disposed in an order of the silicon wafer, the reaction suppressing layer, the stress generating layer and the active layer, where the reaction suppressing layer is a nitride crystal layer that suppresses reaction between silicon atoms and group-III atoms, the stress generating layer is a nitride crystal layer that generates compressive stress, the active layer is a nitride crystal layer in which an electronic device is formed, and the semiconductor wafer further has, between the silicon wafer and the reaction suppressing layer, a SiAlN layer having silicon atoms, aluminum atoms and nitrogen atoms as main constituent atoms.

8 Claims, 10 Drawing Sheets

(51) Int. Cl.
*H01L 29/812* (2006.01)
*H01L 21/205* (2006.01)
*C23C 16/34* (2006.01)
*C23C 16/42* (2006.01)

(58) Field of Classification Search
CPC ......... H01L 21/02505; H01L 21/02507; H01L 21/0251; H01L 21/0254; H01L 21/02458; H01L 21/02381; C23C 16/34; C23C 16/42
See application file for complete search history.

(56) References Cited

U.S. PATENT DOCUMENTS

| | | |
|---|---|---|
| 9,111,839 B2 | 8/2015 | Hoteida et al. |
| 2012/0126293 A1 | 5/2012 | Sumiya et al. |
| 2014/0209862 A1 | 7/2014 | Ikuta et al. |
| 2015/0332914 A1 | 11/2015 | Yamada et al. |
| 2017/0236906 A1 | 8/2017 | Yamada et al. |

FOREIGN PATENT DOCUMENTS

| | | |
|---|---|---|
| JP | 2010-232322 A | 10/2010 |
| JP | 2013-21124 A | 1/2013 |
| JP | 2013-145821 A | 7/2013 |
| WO | WO 2011/016304 A1 | 2/2011 |
| WO | WO 2013/042504 A1 | 3/2013 |
| WO | WO 2016/072521 A1 | 5/2016 |

OTHER PUBLICATIONS

International Preliminary Report on Patentatbility issued in the corresponding International Application No. PCT/JP2017/042919 dated Jun. 4, 2019 including an English translation of the Written Opinion of the International Seaching Authority.

Matsumoto et al., "Present Status and Challenge of Metal Organic Vapor Phase Epitaxy Equipment for the Epitaxial Growth of GaN Power Electronic Devices on Silicon Substrate," Journal of the Vaccum Society of Japan, Dec. 15, 2011, vol. 54, No. 6, pp. 376-380, in particular, table 1.

Extended European Search Report, dated Jul. 3, 2020, for European Application No. 17877275.2.

Radtke et al., "Scanning Transmission Electron Microscopy Investigation of the Si(111)/AlN Interface Grown by Metalorganic Vapor Phase Epitaxy," Applied Physics Letters, vol. 97, No. 25, 2010 (Dec. 20, 2010), pp. 251901-1 to 251901-3.

* cited by examiner

SEMICONDUCTOR WAFER

The contents of the following Japanese patent applications are incorporated herein by reference:
NO. 2016-231902 filed in JP on Nov. 30, 2016, and
NO. PCT/JP2017/042919 filed on Nov. 29, 2017.

BACKGROUND

1. Technical Field

The present invention relates to a semiconductor wafer.

As a technology for growing a group-III nitride semiconductor crystal on a Si wafer, technologies as shown in the following documents, for example, have been considered.

Patent Document 1 has disclosed a group-III nitride epitaxial wafer that is made to suppress cracks occurring during a device forming process. The group-III nitride epitaxial wafer is characterized by including a Si wafer, an initial layer that is in contact with the Si wafer, and a super-lattice stack that is formed on the initial layer and that has a plurality of sets of stacks each having a first layer formed of AlGaN having an Al composition ratio that is larger than 0.5 and is 1 or less, and a second layer formed of AlGaN having an Al composition ratio that is larger than 0 and is 0.5 or less in this order, where the Al composition ratio of the second layer gradually decreases in a direction away from the wafer.

The Patent Document 2 has disclosed a compound semiconductor wafer that can suppress occurrence of cracks, crystal defect or warp of a nitride semiconductor layer, and can improve productivity. The compound semiconductor wafer includes a silicon single crystal wafer having a crystalline plane orientation denoted as the (111) plane, a first buffer layer formed on the silicon single crystal wafer and made of $Al_xGa_{1-x}N$ single crystal ($0<x\le1$), a second buffer layer formed on the first buffer layer and including a plurality of first single layers and a plurality of second single layers that are alternately stacked, each first single layer being made of $Al_yGa_{1-y}N$ single crystal ($0\le y<0.1$) having a thickness of 250 nm or more and 350 nm or less, and each second single layer being made of $Al_zGa_{1-z}N$ single crystal ($0.9<z\le1$) having a thickness of 5.0 nm or more and 20 nm or less, and a semiconductor device forming region formed on the second buffer layer and including at least one or more of nitride-based semiconductor single crystal layers.

Patent Document 3 has disclosed a semiconductor electronic device that can further reduce leak current while suppressing a wafer from warping. The semiconductor electronic device is a semiconductor electronic device that includes a compound semiconductor layer stacked on a wafer with a buffer layer placed therebetween, where the buffer layer has a composite layer in which a second layer is stacked on a first layer, the second layer formed by using a nitride-based compound semiconductor having an Al composition of 0.8 or more, the first layer formed by using a nitride-based compound semiconductor having an Al composition of 0.2 or less.

The Non-Patent Document 1 has described that "it is prospective that if a film can be grown by alternately stacking GaN and AlN such that lattice relaxation is included in AlN on GaN and compressive stress is left in GaN on AlN, the entire film can have the compressive stress by using a strained periodic structure (generally called Strained Layer Super-lattice; hereinafter, referred to as SLS) of GaN/AlN. It is considered that in addition to the SLS, the compressive stress can also be added by using a combination in which an upper stacked film has a larger lattice constant."

PRIOR ART LITERATURE

Patent Document

[Patent Document 1] Japanese Patent Application Publication No. 2013-021124
[Patent Document 2] Japanese Patent Application Publication No. 2010-232322
[Patent Document 3] Japanese Patent Application Publication No. 2008-171843

Non-Patent Document

[Non-Patent Document 1] K. Matsumoto et al., J. Vac. Soc. Jpn. 54, 6 (2011), p 376-380.

SUMMARY

When a group-III nitride semiconductor layer is formed on a Si wafer, the wafer may be warped, and the group-III nitride semiconductor layer may crack due to the difference in thermal expansion coefficient between Si and the group-III nitride semiconductor crystal. To address this issue, as described in the above-mentioned Patent and Non-Patent Documents, a layer in which internal compressive stress is generated (a stress generating layer) is formed in order to balance the generated compressive stress and the tensile stress generated in the nitride crystal layer due to the difference in thermal expansion coefficient. In this way, the semiconductor wafer is prevented from being warped when the room temperature is restored, and the group-III nitride semiconductor layer is prevented from cracking.

However, there are still many things unclear about the control of the warp of a semiconductor wafer by a stress generating layer. Accordingly, it is also important to observe a relation between a structure, crystallinity, a chemical state and the like of a crystal layer disposed between the stress generating layer and the Si wafer, and a result of warp experiment. From such a point of view, as a result of experiments and studies for the relation between the structure and the like of the crystal layer disposed between the stress generating layer and the Si wafer described above or the stress generating layer, and the warpage the present inventors achieved the present invention.

The purpose of the present invention is to provide a semiconductor wafer whose warpage is small when forming a group-III nitride semiconductor crystal layer by using an epitaxial growth method.

To solve the above-described issue, in a first aspect of the present invention, a semiconductor wafer is provided, which includes a silicon wafer, a reaction suppressing layer, a stress generating layer and an active layer, the silicon wafer, the reaction suppressing layer, the stress generating layer and the active layer disposed in an order of the silicon wafer, the reaction suppressing layer, the stress generating layer and the active layer, where the reaction suppressing layer is a nitride crystal layer that suppresses a reaction between a silicon atom and a group-III atom, the stress generating layer is a nitride crystal layer in which compressive stress is generated, the active layer is a nitride crystal layer in which an electronic device is formed, and the semiconductor wafer further includes, between the silicon wafer and the reaction suppressing layer, a SiAlN layer formed of silicon atoms, aluminum atoms and nitrogen atoms as main constituent atoms.

The thickness of the SiAlN layer can be made to be 1.8 nm or less. The SiAlN layer can be made to have a periodic structure. An energy loss value, obtained by an EELS measurement, of the SiAlN layer at a Si-atom L-edge peak of a is preferably larger than that of a bulk Si by $\Delta E$, and as the $\Delta E$, a value being equal to or larger than 3.1 eV and equal to or less than 4.8 eV can be given.

As an example of the reaction suppressing layer, $Al_zGa_{1-z}N$ ($0.9 \leq z \leq 1$) can be given. As examples of the stress generating layer, any one of the following structures can be given: a first structure that is a first multilayered crystal layer including a first crystal layer in which the bulk crystal lattice constant is a1 and a second crystal layer in which the bulk crystal lattice constant is a2 (a1<a2); a second structure that is a second multilayered crystal layer including the first crystal layer, the second crystal layer and a third crystal layer in which the bulk crystal lattice constant is a3 (a2<a3); a third structure that is a graded crystal layer in which the bulk crystal lattice constant increases in a continuous or stepwise manner in a direction away from the silicon wafer; and a fourth structure that is a multilayered crystal layer in which a plurality of the first multilayered crystal layers, a plurality of the second multilayered crystal layers or a plurality of the graded crystal layers are repeatedly stacked. In particular, as examples of the stress generating layer, the first multilayered crystal layer including a first crystal layer in which the bulk crystal lattice constant is a1 and a second crystal layer in which the bulk crystal lattice constant is a2 (a1<a2), or the multilayered crystal layer in which a plurality of the first multilayered crystal layers are repeatedly stacked is preferable. In this case, $Al_xGa_{1-x}N$ ($0.9 \leq x \leq 1$) can be given as an example of the first crystal layer, and $Al_yGa_{1-y}N$ ($0 \leq y \leq 0.3$) can be given as the second crystal layer.

The active layer may also include a layer formed of $Al_pGa_{1-p}N$ ($0 \leq p \leq 0.1$). Between the reaction suppressing layer and the stress generating layer, an intermediate layer formed of $Al_qGa_{1-q}N$ ($0 \leq q \leq 1$, q<z) may also be further included. The thickness of the intermediate layer is preferably 20 nm or more and 600 nm or less.

DESCRIPTION OF EXEMPLARY EMBODIMENTS

Figure 1:
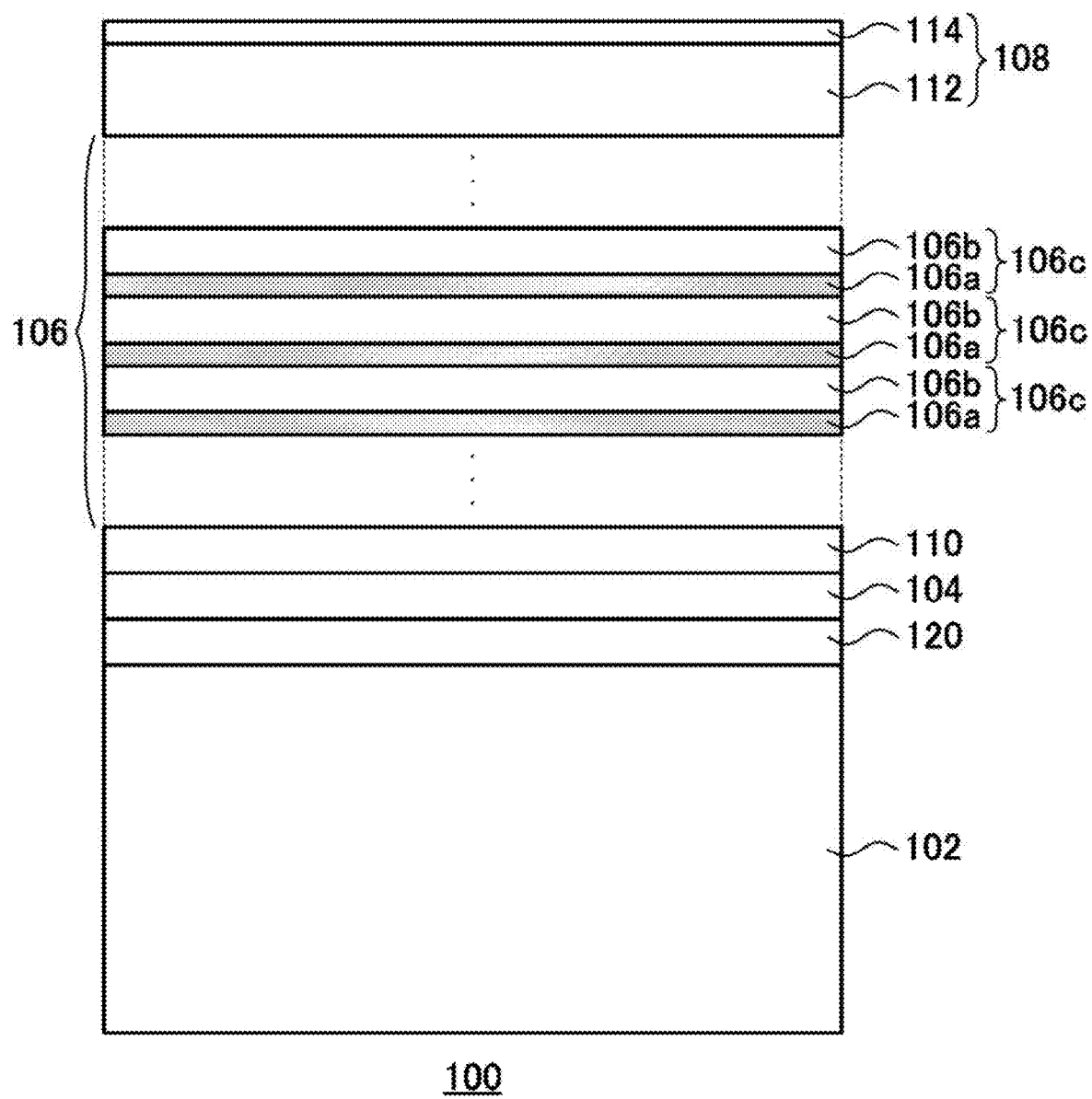
FIG. 1 shows a cross-sectional view of a semiconductor wafer 100.

FIG. 1 shows a cross-sectional view of the semiconductor wafer 100. The semiconductor wafer 100 includes a silicon wafer 102, a reaction suppressing layer 104, a stress generating layer 106 and a device forming layer 108, and includes an intermediate layer 110 between the reaction suppressing layer 104 and the stress generating layer 106, and a SiAlN layer 120 between the silicon wafer 102 and the reaction suppressing layer 104. The stress generating layer 106 has a first multilayered crystal layer 106c that includes a first crystal layer 106a and a second crystal layer 106b. The device forming layer 108 has an active layer 112 and a Schottky layer 114. The silicon wafer 102, the reaction suppressing layer 104, the stress generating layer 106 and the active layer 112 are disposed in an order of the silicon wafer 102, the reaction suppressing layer 104, the stress generating layer 106 and the active layer 112. The reaction suppressing layer 104, the stress generating layer 106 and the active layer 112 are nitride crystal layers.

The silicon wafer 102 is a support wafer that supports respective layers which are upper layers than the SiAlN layer 120. By using the silicon wafer 102, material costs can be reduced, and a semiconductor manufacturing apparatus used during a conventional silicon process can be utilized. Accordingly, cost competitiveness can be enhanced. Further, by using a silicon wafer as the base wafer 102, a large wafer whose diameter is 150 mm or more can be industrially utilized at a low price.

The SiAlN layer 120 is disposed between the silicon wafer 102 and the reaction suppressing layer 104, and is formed of silicon atoms, aluminum atoms and nitrogen atoms as main constituent atoms. It is preferable that the SiAlN layer 120 has the thickness of 1.8 nm or less. Also, the SiAlN layer 120 can be made to have a periodic structure. Further, the SiAlN layer 120 can be made to have an energy loss value, obtained by an Electron Energy Loss Spectroscopy (EELS) measurement, at a Si-atom L-edge peak, which is larger than that of a bulk Si by $\Delta E$, and the $\Delta E$ is 3.1 eV or more and 4.8 eV or less.

Here, the "thickness" of the SiAlN layer 120 is measured according to a difference of cyclic gradations in a Transmission Electron Microscopy (TEM) image. For example, a position of an interface between the silicon wafer 102 and the SiAlN layer 120 and a position of an interface between the SiAlN layer 120 and an upper layer on the SiAlN layer 120 (the reaction suppressing layer 104 in the present embodiment) can be specified by the difference of the cyclic gradations in the TEM image, and a distance between the two interfaces can be defined as the thickness. As a method of specifying the interface position, for example, in lightness profiles of a plurality of lines obtained from a region of the silicon wafer 102 (or the reaction suppressing layer 104) to a region of the SiAlN layer 120 in a TEM image, a line position at which an intensity in a specific period obtained by performing Fourier transformation on the lightness profiles is reduced or becomes to 0 can be specified as the interface position. Note that the lower limit of the thickness of the SiAlN layer 120 can be set to be approximately 1 atom layer.

Also, the term "periodic structure" indicates a structure of the SiAlN layer 120 having some periodicity when the structure is analyzed by x-ray diffraction, electron beam diffraction or the like. For example, the periodicity of the atom arrangement can be detected by a Bright Field-Scanning TEM (BF-STEM) image and an electron beam diffraction image.

The reaction suppressing layer 104 is a nitride crystal layer that suppresses a reaction between a silicon atom contained in the silicon wafer 102 and the like, and a Group-III atom contained in the stress generating layer 106 and the like. When the nitride crystal layer that is upper than the reaction suppressing layer 104 is a GaN-based semiconductor layer such as AlGaN and GaN, alloying between Ga atoms and silicon atoms contained in the GaN-based semiconductor layer can be prevented. As an example of the reaction suppressing layer 104, $Al_zGa_{1-z}N$ ($0.9 \le z \le 1$) can be given, and as a representative example, an AlN layer can be given. According to the reaction suppressing layer 104, a surface of the silicon wafer 102 can be protected, and accordingly, the upper layers can be surely supported. Also, the reaction suppressing layer 104 can form an initial nucleus of a crystal layer that is formed on the silicon wafer 102. The thickness of the reaction suppressing layer 104 can be made to be 30 nm or more and 300 nm or less.

The intermediate layer 110 is a nitride crystal layer disposed between the reaction suppressing layer 104 and the stress generating layer 106. The intermediate layer 110 is any component and is not a necessary component for the semiconductor wafer 100. When the intermediate layer 110 is disposed in contact with the reaction suppressing layer 104, the lattice constant of the intermediate layer 110 in a bulk crystal state is preferably larger than the lattice constant of the reaction suppressing layer 104 in a bulk crystal state. As an example of the intermediate layer 110, for example, $Al_qGa_{1-q}N$ ($0 \le q \le 1$, $q<z$) can be given. The intermediate layer 110 can be ideally formed such that the crystal lattices of the intermediate layer 110 are coherently continuous from the crystal lattices of the reaction suppressing layer 104 at the hetero-junction plane between the intermediate layer 110 and the reaction suppressing layer 104. Accordingly, in the intermediate layer 110, the compressive stress can be generated due to a difference in the lattice constants from the reaction suppressing layer 104. Also, in the intermediate layer 110, the initial nucleus formed in the reaction suppressing layer 104 is expanded, and a base surface of the stress generating layer 106 formed on the upper layer can be formed. The thickness of the intermediate layer 110 can be made to be 20 nm or more and 600 nm or less, for example, 300 nm. Note that the above describes that the intermediate layer 110 and the reaction suppressing layer 104 are coherently continuous at the hetero interface therebetween, but this requirement is merely ideal. In reality, lattice relaxation occurs due to defects and the like and the coherently grown regions are merely dominant.

The stress generating layer 106 is disposed between the silicon wafer 102 and the device forming layer 108, in which the compressive stress is generated. The stress generating layer 106 functions as a stress generating layer that reduces the warp of the entire semiconductor wafer 100. The compressive stress can be generated by a distortion super-lattice structure within the stress generating layer 106.

The stress generating layer 106 in the present embodiment is a multilayered crystal layer in which a plurality of first multilayered crystal layers 106c are repeatedly stacked, each first multilayered crystal layer 106c including a first crystal layer 106a and a second crystal layer 106b. The first crystal layer 106a has a bulk crystal lattice constant a1, and the second crystal layer 106b has a bulk crystal lattice constant a2 (a1<a2). The number of the repeatedly stacks of the first multilayered crystal layers 106c can be made to be 2 to 500, for example. By stacking a large number of the first multilayered crystal layers 106c, the compressive stress generated in the stress generating layer 106 can be large. Also, the magnitude of the compressive stress generated in the stress generating layer 106 can be easily controlled by the number of the stacks of the first multilayered crystal layers 106c. Further, by stacking a large number of the first multilayered crystal layers 106c, the improvement of the blocking voltage by the first crystal layer 106a can be further enhanced.

Here, although a structure in which a plurality of first multilayered crystal layers 106c are repeatedly stacked as the stress generating layer 106 has been described, a plurality of the first multilayered crystal layers 106c may not be repeatedly stacked, and in this case, the first multilayered crystal layer 106c constitutes the stress generating layer 106. Alternatively, the stress generating layer 106 may also be set to be a second multilayered crystal layer that includes, in addition to the first crystal layer 106a and the second crystal layer 106b, a third crystal layer having a bulk crystal lattice constant a3 (a2<a3). Alternatively, the stress generating layer 106 may also be set to be a graded crystal layer having a bulk crystal lattice constant that increases in a continuous or stepwise manner in a direction away from the silicon wafer 102. Further, the stress generating layer 106 may also be set to be a multilayered crystal layer in which a plurality of the first multilayered crystal layers 106c, the second multilayered crystal layers or the graded crystal layers are repeatedly stacked.

As an example of the first crystal layer 106a, $Al_xGa_{1-x}N$ ($0.9 \le x \le 1$) can be given, and as an example of the second crystal layer 106b, $Al_yGa_{1-y}N$ ($0 \le y \le 0.3$) can be given. The thickness of the first crystal layer 106a can be made to be 1 nm or more and 20 nm or less, and preferably, can be made to be larger than 5.0 nm and less than 20 nm. The thickness of the second crystal layer 106b can be made to be 5 nm or more and 300 nm or less, and preferably, can be made to be 10 nm or more and 300 nm or less.

The device forming layer 108 is a crystal layer in which any device such as a transistor or a light emitting diode (LED) can be formed, and for example, when a High Electron Mobility Transistor (HEMT) in which a two-dimensional electron gas (2 DEG) is taken as a channel is to be formed, the device forming layer 108 can include an active layer 112 and a Schottky layer 114. As an example of the active layer 112, a GaN layer can be given, and as an example of the Schottky layer 114, an AlGaN layer can be given.

When the thermal expansion coefficient of the device forming layer 108 is larger than the thermal expansion coefficient of the silicon wafer 102, the average lattice constant of the second crystal layer 106b can be made to be larger than the average lattice constant of the first crystal layer 106a. That is, when the device forming layer 108 is formed by a MOCVD method and the like under a high-temperature environment, as the semiconductor wafer 100 is restored to a room temperature, thermal contraction of the device forming layer 108 receives larger tensile stress than the silicon wafer 102. In such a case, as described above, when the lattice constant in the bulk state of the second crystal layer 106b is set to be larger than the lattice constant in the bulk state of the first crystal layer 106a, the compressive stress is generated in the stress generating layer 106 and the tensile stress by the device forming layer 108 can be cancelled.

The active layer 112 is a nitride crystal layer in which an electronic device is to be formed. The active layer 112 may also include a layer formed of $Al_pGa_{1-p}N$ (0≤p≤0.1). As a representative example of the active layer 112, a GaN layer can be given. The active layer 112 may also be an AlInGaN layer. The active layer 112 can be divided into two layers, where the upper layer can be a high-purity layer formed of carbon atoms and the like having an impurity concentration as small as possible, and the lower layer can be a layer containing carbon atoms. The presence of the carbon atoms in the lower layer can contribute to increase the blocking voltage and the high purity of the upper layer can contribute to reduce the scattering of the carriers caused by the impurity atoms and thus increase the mobility.

The Schottky layer 114 is, for example, an $Al_{x5}Ga_{1-x5}N$ (0<x5<1). Two-dimensional electron gas (2 DEG) is generated at the hetero interface between the active layer 112 and the Schottky layer 114, which can function as a channel layer of the transistor. The Schottky layer 114 can be appropriately modified in accordance with the structure of the transistor to be formed.

The thickness of the nitride crystal layer including the stress generating layer 106 and the device forming layer 108 disposed on the silicon wafer 102 can be made to be 6 nm or more and 20000 nm or less, and preferably, can be 500 nm or more and 13000 nm or less. Since the nitride crystal layer is configured to have a thickness within this range, the warpage of the semiconductor wafer 100 can be reduced. When the silicon wafer 102 has a thickness of 400 μm or more and the silicon wafer 102 has a diameter of 100 mm or more, the reaction suppressing layer 104 preferably has a thickness of 30 nm or more and 300 nm or less. Since the silicon wafer 102 and the reaction suppressing layer 104 are configured to satisfy the above ranges, the warpage of the semiconductor wafer 100 can be reduced.

The reaction suppressing layer 104, the intermediate layer 110, the stress generating layer 106 and the device forming layer 108 disposed on the silicon wafer 102 can be formed by using a general Metal Organic Chemical Vapor Deposition (MOCVD) method. For example, when the layers formed by the MOCVD method are respectively an AlN layer, an AlGaN layer and a GaN layer, trimethylaluminum ($Al(CH_3)_3$) and trimethylgallium ($Ga(CH_3)_3$) can used as the group-III source material gas, and ammonia ($NH_3$) can be used as nitrogen source material gas. The growth temperature is selectable within a range from 1100° C. to 1260° C., and a V/III ratio, that is, a flow rate ratio of the group-V source material gas to the group-III source material gas is selectable within a range from 160 to 3700. For the thickness of the layer to be formed, growth time corresponding to the designed thickness can be calculated from, for example, a growth rate obtained by a preliminary experiment, and the thickness of each layer can be controlled by the growth time.

For a process of forming the SiAlN layer 120, a nitriding treatment of the surface of the silicon wafer 102 can be used. For example, before forming the reaction suppressing layer 104 by using the MOCVD method, maintaining the growth temperature and the other conditions excluding the source material gas to be the same as those at the time of forming the reaction suppressing layer 104, the nitrogen source material gas only can first flow to perform the nitriding treatment on the surface of the silicon wafer 102. The thickness of the SiAlN layer 120 can be controlled by the time at which the nitrogen source material gas first flows (the time for the nitriding treatment). Note that although the nitriding treatment by first flowing the nitrogen source material gas is shown as an example of the method of forming the SiAlN layer 120, other methods may also be used. For example, the SiAlN layer 120 may also be formed by the MOCVD method by mixing silicon source material gas (for example, silane, disilane and the like) containing Si atoms into the group-III source material gas and the nitrogen source material gas.

In the above-described semiconductor wafer 100, the thermal expansion coefficient of the nitride crystal layer formed on the silicon wafer 102 is larger than the silicon wafer 102. As the temperature of the wafer that is high at the time of epitaxial growth is restored to a temperature near the room temperature, the nitride crystal layer is contracted largely than the silicon wafer 102, and as a result, the tensile stress is generated in the nitride crystal layer. However, according to the semiconductor wafer 100 of the present embodiment, the compressive stress is generated by the presence of the SiAlN layer 120 and the presence of the stress generating layer 106, the compressive stress is balanced by the tensile stress according to the decrease of the temperature of the nitride crystal layer, and the warp of the semiconductor wafer 100 can be suppressed. In particular, by making the thickness of the SiAlN layer 120 to be 1.8 nm or less, alternatively, by making the SiAlN layer 120 in a periodic structure, or alternatively, by making the energy loss value of the SiAlN layer 120 at the Si-atom L-edge peak obtained by the EELS measurement to be larger than that of a bulk Si by ΔE, the ΔE being 3.1 eV or more and 4.8 eV or less, the effect of reducing the warp can be further surely achieved by the stress generating layer 106.

Although the above has described an example in which the intermediate layer 110 is formed between the reaction suppressing layer 104 and the stress generating layer 106, the intermediate layer 110 may also be formed on an upper layer of the device forming layer 108 between the stress generating layer 106 and the device forming layer 108.

EMBODIMENTS

Three samples (semiconductor wafers 100) were manufactured, where each SiAlN layer 120 was formed by performing the nitriding treatment by first flowing the nitrogen source material gas, and the time at which the nitrogen source material gas first flows (the time for the nitriding treatment) for the three samples changes respectively as 20 seconds, 120 seconds and 600 seconds. That is, a Si wafer with the (111) plane as the main plane is used as the silicon wafer 102, after the nitriding treatment by first flowing the nitrogen source material gas for the above-described predetermined time, the reaction suppressing layer 104, the intermediate layer 110, the stress generating layer 106 and the device forming layer 108 were formed. As the reaction suppressing layer 104 and the intermediate layer 110, an AlN layer having a designed thickness of 150 to 160 nm and an AlGaN layer having a designed thickness of 250 nm were formed. As the stress generating layer 106, a plurality of AlN/AlGaN stacked structures (the first multilayered crystal layers 106c) each including an AlN layer (the first crystal layer 106a) having the designed thickness of 5 nm and an AlGaN layer (the second crystal layer 106b) having the designed thickness of 28 nm were repeatedly stacked and formed, and as the device forming layer 108, a GaN layer (the active layer 112) having the designed thickness of 800 nm and an AlGaN layer (the Schottky layer 114) having the designed thickness of 20 to 50 nm were formed.

The MOCVD method was used for forming the reaction suppressing layer 104, the intermediate layer 110, the stress generating layer 106 and the device forming layer 108 (the AlN layer, the AlGaN layer and the GaN layer), trimethylaluminum and trimethylgallium were used as the group-III source material gas, and ammonia was used as the nitrogen source material gas. The growth temperature was selected within a range within a range from 1100° C. to 1260° C., and a V/III ratio, that is, a flow rate ratio of the group-V source material gas to the group-III source material gas was selected within a range from 160 to 3700. Because the thickness of each layer was controlled by the growth time calculated from the growth rate obtained by a preliminary experiment, the actual thickness of each layer is different from each designed thickness.

Since the warpage of the semiconductor wafer 100 in the sample that the time for nitriding treatment was 20 seconds (the experimental example 1) and in the sample the time for nitriding treatment was 120 seconds (the experimental example 2) was within an acceptance determination range and was a non-defective product, the two samples were taken as the experimental examples. Since the warpage in the sample that the time for nitriding treatment was 600 seconds was out of the acceptance determination range and was a defective product, the sample was taken as the comparative example.

Figure 2:
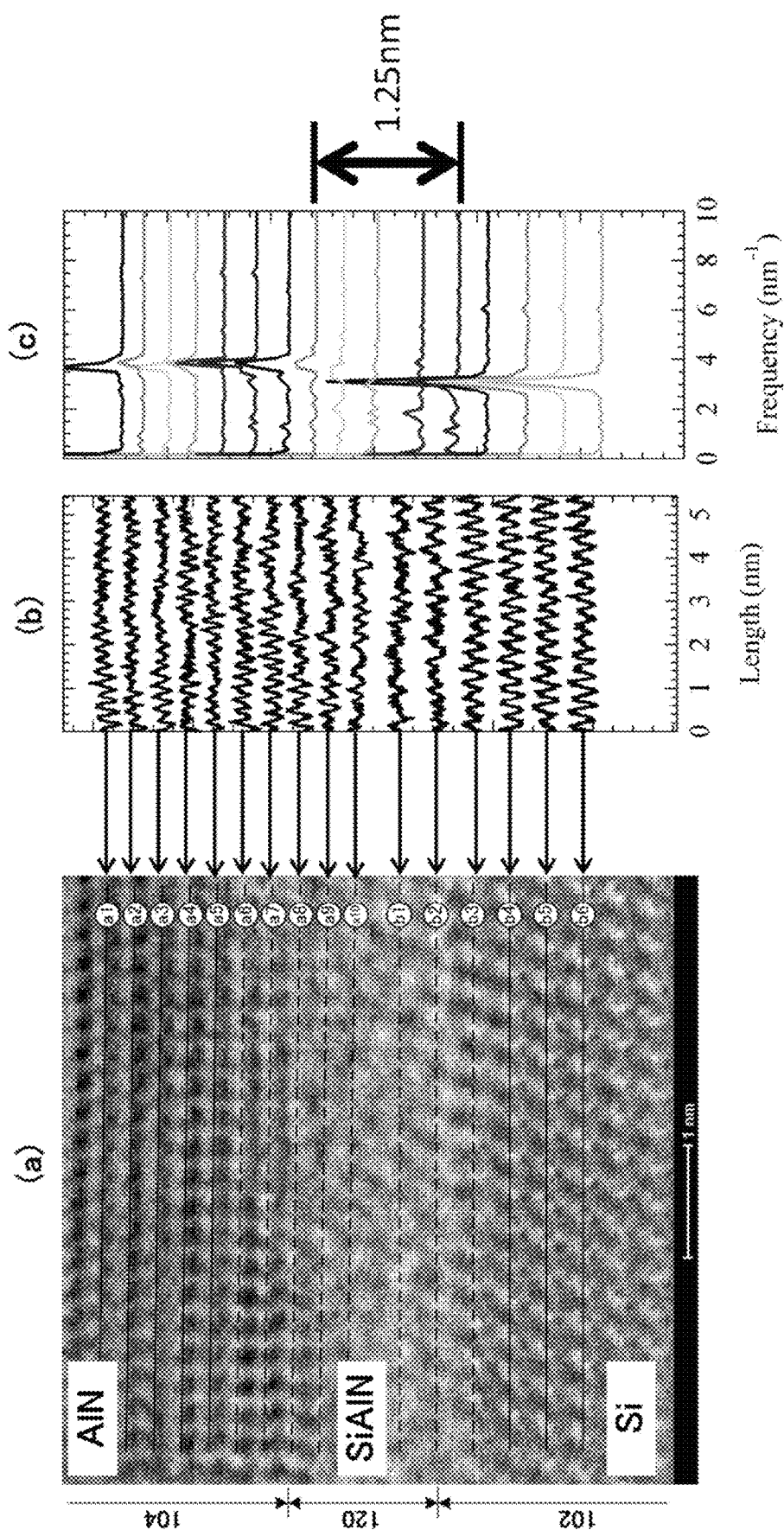
FIG. 2 shows a view for measuring the thickness of a SiAlN layer 120 in an experimental example 1.
Figure 3:
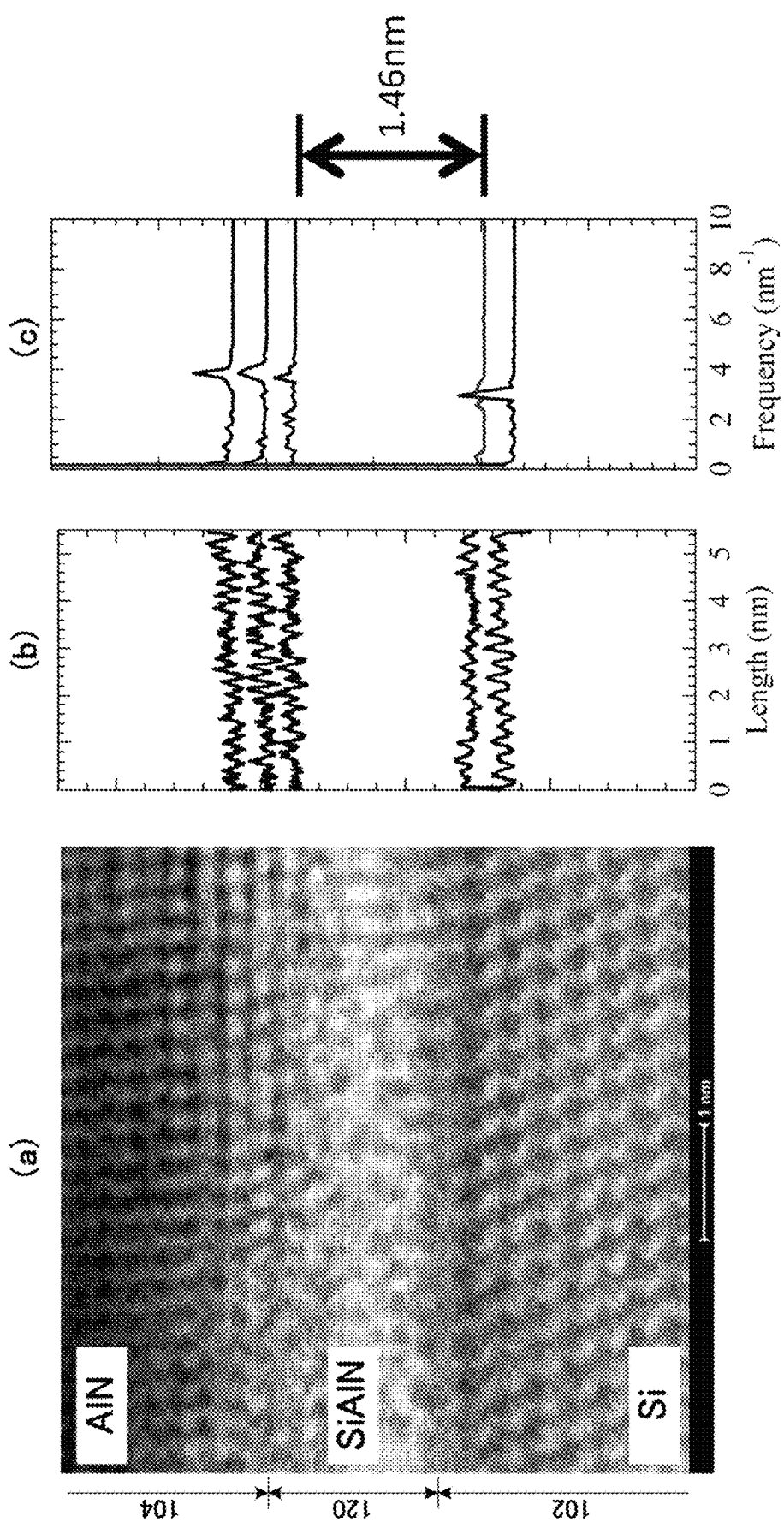
FIG. 3 shows a view for measuring the thickness of a SiAlN layer 120 in an experimental example 2.
Figure 4:
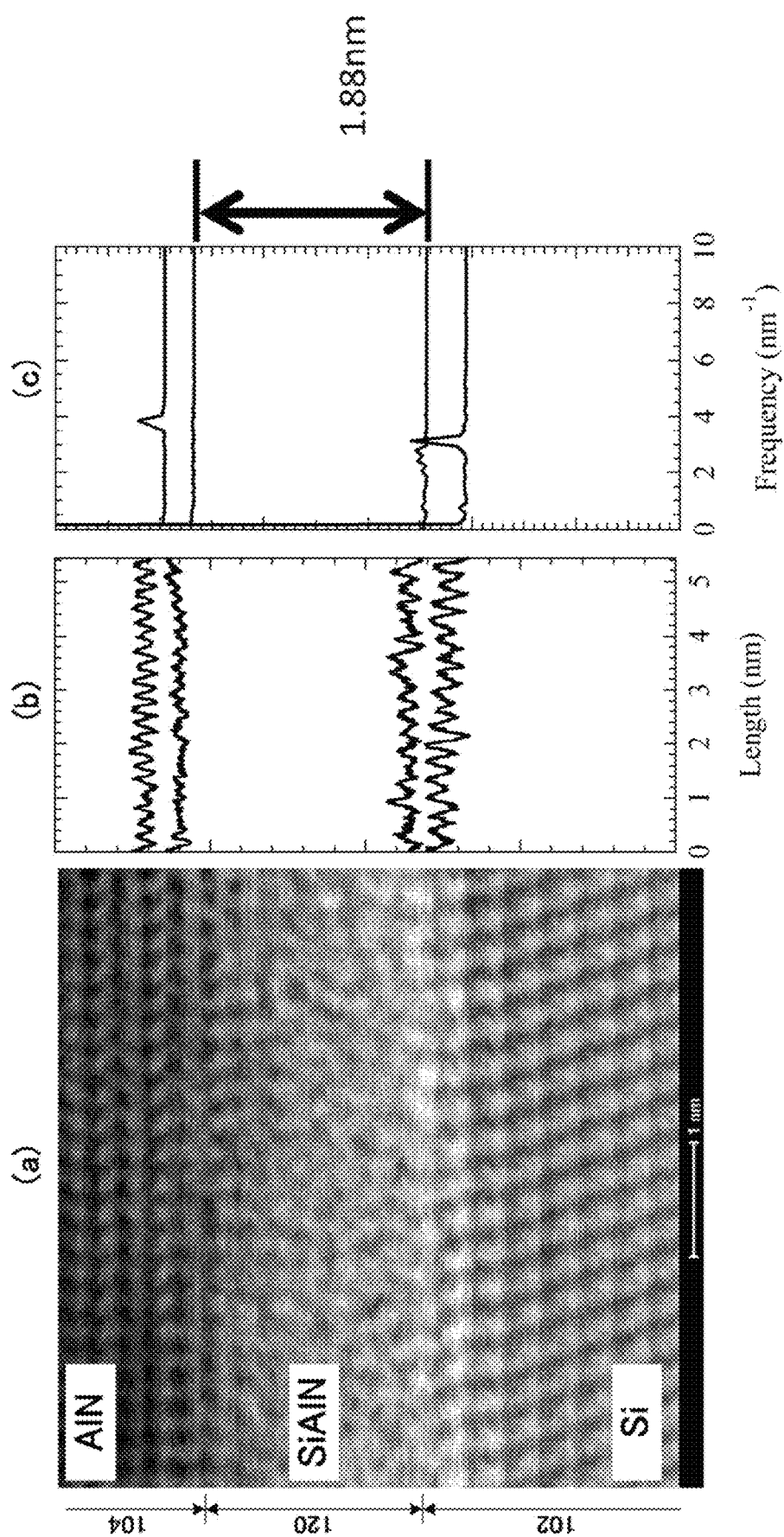
FIG. 4 shows a view for measuring the thickness of a SiAlN layer 120 in a comparative example.

FIG. 2 shows a view for measuring the thickness of the SiAlN layer 120 in the experimental example 1, FIG. 3 shows a view for measuring the thickness of the SiAlN layer 120 in the experimental example 2, and FIG. 4 shows a view for measuring the thickness of the SiAlN layer 120 in the comparative example. In each of FIG. 2 to FIG. 4, (a) indicates a BF-STEM image, (b) indicates a contrast profile along a specific line in the BF-STEM image, and (c) indicates frequency spectrum of the contrast profile on which the Fourier transformation was performed on the contrast profile of (b). In (a) of each of FIG. 2 to FIG. 4, gradations of atom images in the BF-STEM image are shown, where the atom image of the reaction suppressing layer 104 (AlN) is shown in an upper region, the atom image of the SiAlN layer 120 (SiAlN) is shown in a middle region, and the atom image of the silicon wafer 102 (Si) is shown in a lower region. The atom images in the upper region and the lower region are clearly shown, and the atom image in the middle region is relatively unclear.

Hereinafter, FIG. 2 is used as an example to describe a method of measuring the thickness of the SiAlN layer 120. First, parallel lines, such as lines a1, a2, a3 . . . , are drawn so as to be along the gradations (peaks) of the atom image in the upper region in (a) of FIG. 2, and an interval between the parallel lines is set to be fixed, and parallel lines extending to the middle region are set (lines a1 to a10). Similarly, parallel lines, such as lines b6, b5, b4 . . . , are drawn so as to be along the gradations (peak) of the atom image in the lower region, and an interval between the parallel lines is set to be fixed, and parallel lines extending to the middle region are set (lines b6 to b1). For each of the set lines a1 to a10 and lines b6 to b1, the contrast profile of the BF-STEM image along each line is obtained ((b) of FIG. 2), and for each contrast profile, the frequency spectrum for each contrast profile obtained by performing Fourier transformation on each contrast profile is obtained ((c) of FIG. 2). In the upper region and the lower region, the single crystal atom images of AlN and Si are respectively shown, and the contrast profiles at the lines along the single crystal atom images are shown as a vibration waveform in an approximately single period ((b) of FIG. 2), and accordingly, in frequency profiles obtained by performing Fourier transformation on these contrast profiles, the intensity certainly shows a peak in a specific approximately-single frequency.

On the other hand, in the middle region, because the crystal structure is different from that of the upper region and the lower region, the gradations (peak) of the atom image in the middle region deviate from the lines a10, a9 or lines b1, b2 at which the atom arrangement in the upper region or the lower region is performed. Accordingly, the peak intensity, which is in the specific frequency shown in the upper region and the lower region, is reduced or becomes none in the frequency spectrum of the contrast profile along the lines in the middle region, or shows a peak in a different frequency from the specific frequency shown in the upper region and the lower region. Therefore, observing the frequency spectrum of the contrast profile at each line from the upper region or the lower region through the middle region, a line at which the peak value of the intensity in a specific frequency starts to fall can be specified as a boundary between the middle region and the upper region or the lower region. By measuring a distance between the boundary between the upper region and the middle region and the boundary between the lower region and the middle region specified in this way, the distance can be set to be the thickness of the SiAlN layer 120.

Figure 5:
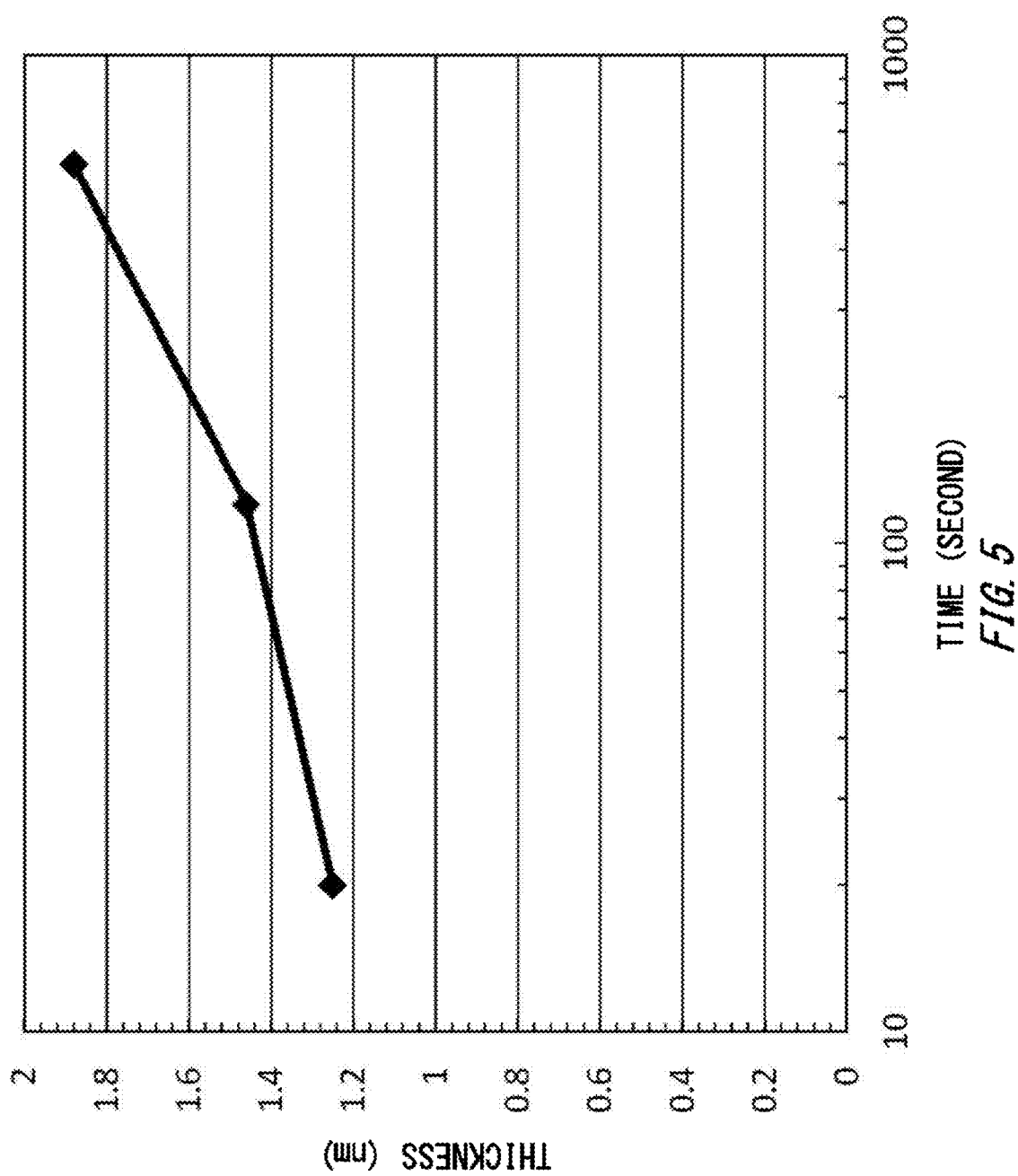
FIG. 5 shows a graph on which the thickness of the SiAlN layer 120 relative to the time for a nitriding treatment is plotted.

The thickness of the SiAlN layer 120 measured by a method as the above was 1.25 nm in the case of the experimental example 1 shown in FIG. 2, was 1.46 nm in the case of the experimental example 2 shown in FIG. 3, and was 1.88 nm in the case of the comparative example shown in FIG. 4. FIG. 5 shows a graph on which the thickness of the SiAlN layer 120 relative to the time for the nitriding treatment is plotted. According to the above-described result, it can be learned that the thickness of the SiAlN layer 120 is preferably 1.8 nm or less.

Figure 6:
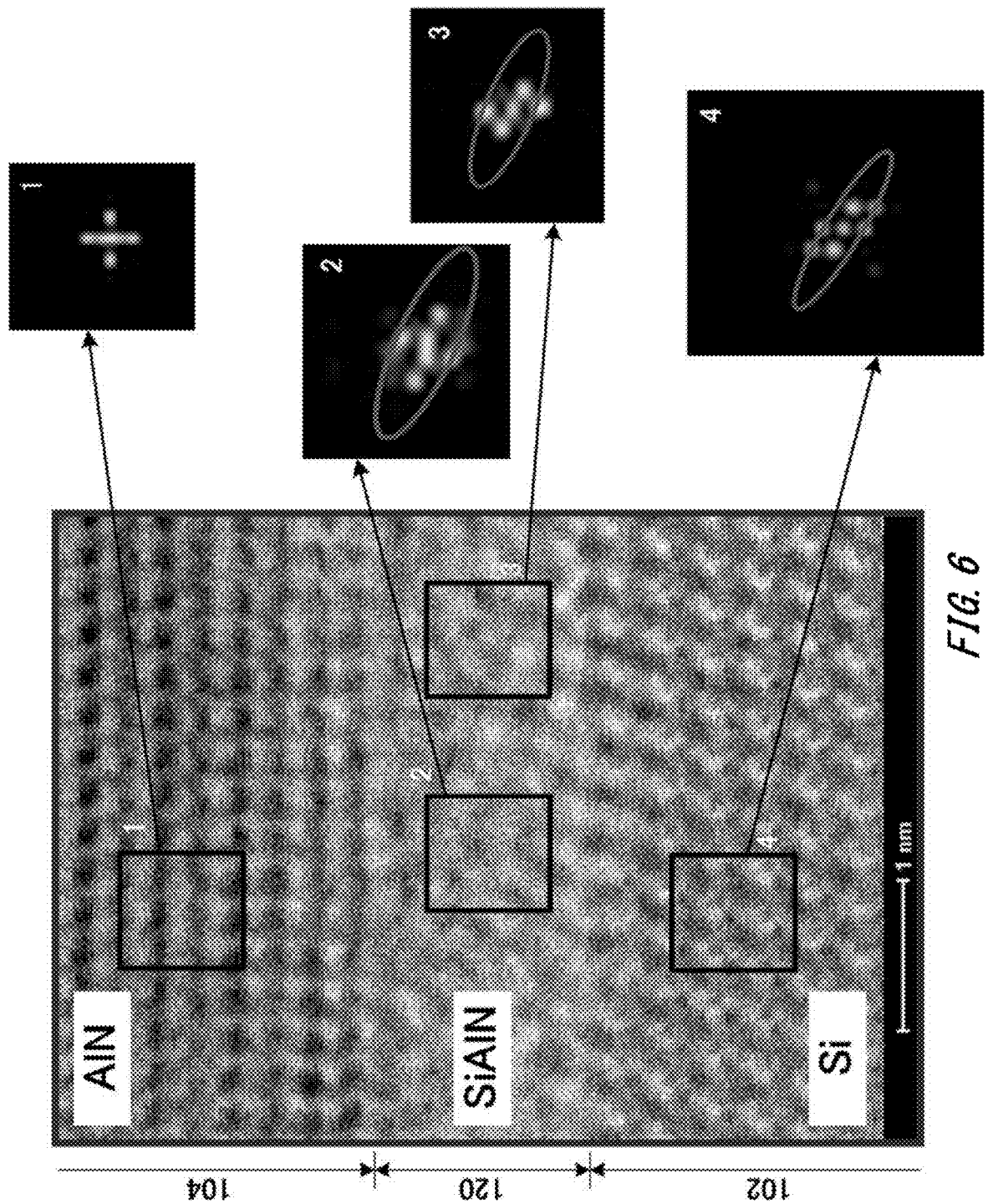
FIG. 6 shows a view for showing periodicity of structure of the SiAlN layer 120 in the experimental example 1.
Figure 7:
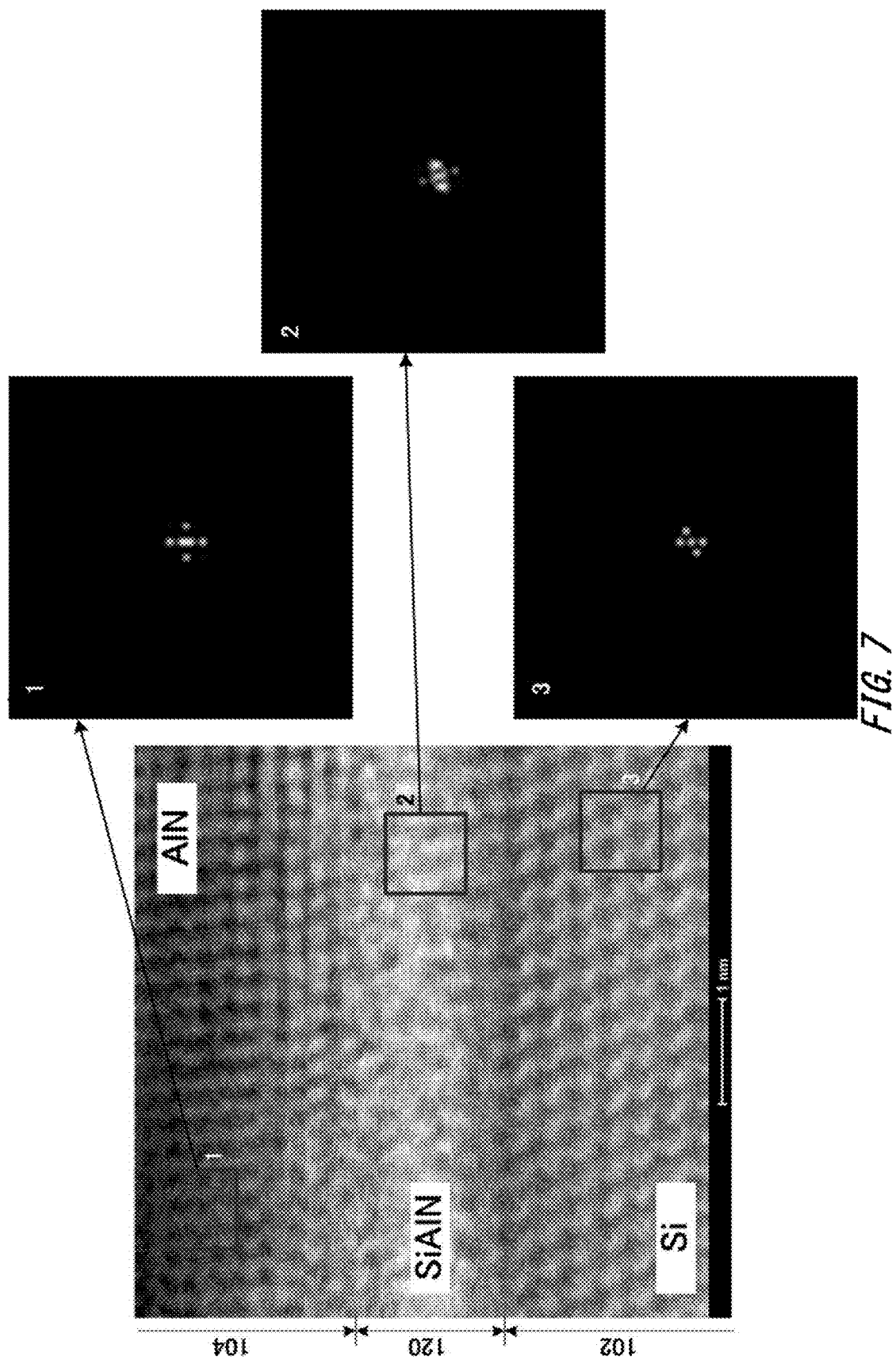
FIG. 7 shows a view for showing periodicity of structure of the SiAlN layer 120 in the experimental example 2.
Figure 8:
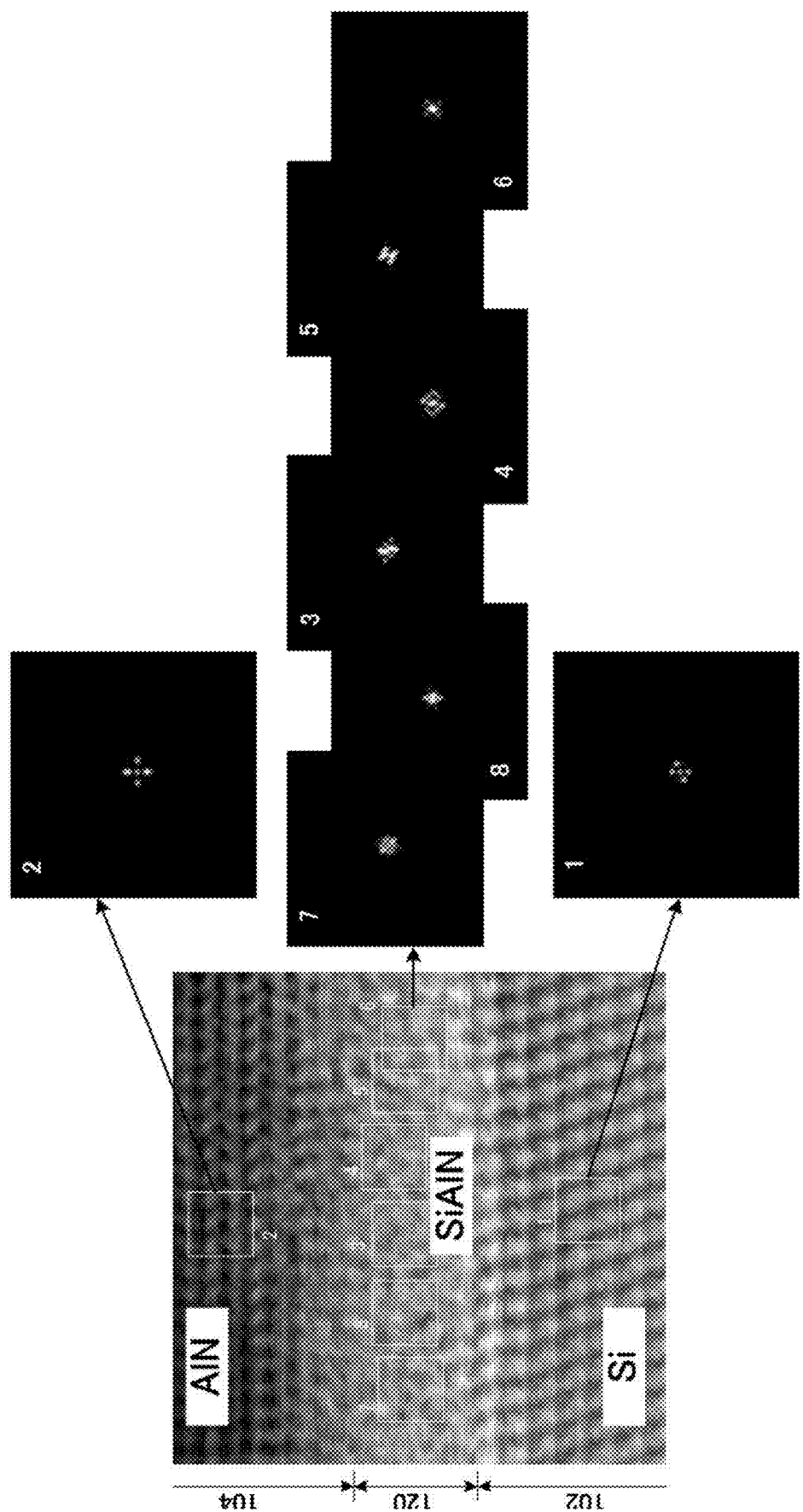
FIG. 8 shows a view for showing periodicity of structure of the SiAlN layer 120 in the comparative example.

FIG. 6 is a drawing for showing a periodicity of structure of the SiAlN layer 120 in the experimental example 1, FIG. 7 is a drawing for showing a periodicity of structure of the SiAlN layer 120 in the experimental example 2, and FIG. 8 is a drawing for showing a periodicity of structure of the SiAlN layer 120 in the comparative example. In each of FIG. 6 to FIG. 8, the picture on the left side shows a BF-STEM image. The right side of the BF-STEM image shows, in respective quadranglular regions, electron beam diffraction images in the respective quadranglular regions to which signs such as 1, 2, . . . are added in the BF-STEM image. The atom image of the reaction suppressing layer 104 (AlN) is shown in the upper region of each BF-STEM image, the atom image of the SiAlN layer 120 (SiAlN) is shown in the middle region, and the atom image of the silicon wafer 102 (Si) is shown in the lower region.

Referring to FIG. 6 for the experimental example 1, it can be said that the clearness of spots and reduction of the number of the spots of the electron beam diffraction image (signs 2 and 3) in the SiAlN layer 120 are equal to those of the electron beam diffraction image (sign 1) in the reaction suppressing layer 104 (AlN) of the upper region and the electron beam diffraction image (sign 4) in the silicon wafer 102 (Si) of the lower region, and the periodicity of structure of the SiAlN layer 120 in the experimental example 1 is high similarly to that of the silicon wafer 102 and the reaction suppressing layer 104.

Also, referring to FIG. 7 for the experimental example 2, it can be said that the clearness of spots and reduction of the number of the spots of the electron beam diffraction image (sign 2) in the SiAlN layer 120 is equal to those of the electron beam diffraction image (sign 1) in the reaction suppressing layer 104 (AlN) of the upper region and the electron beam diffraction image (sign 3) in the silicon wafer 102 (Si) of the lower region, and the periodicity of structure of the SiAlN layer 120 in the experimental example 2 is high similarly to that of the silicon wafer 102 and the reaction suppressing layer 104.

On the other hand, referring to FIG. 8 for the comparative example, the clearness of spots and reduction of the number of the spots of the electron beam diffraction images (signs 3 to 8) in the SiAlN layer 120 are different from those of the electron beam diffraction image (sign 2) in the reaction suppressing layer 104 (AlN) of the upper region and the electron beam diffraction image (sign 1) in the silicon wafer 102 (Si) of the lower region, that is, the ambiguity of the spots increases and the number of the spots also increases. This shows that the periodicity of structure equal to the silicon wafer 102 and the reaction suppressing layer 104 is not maintained in the SiAlN layer 120 of the comparative example and the periodicity of structure is disordered. According to the above result, it can be said that the SiAlN layer 120 in the experimental example 1 and the experimental example 2 has the periodicity that is not present in the SiAlN layer 120 of the comparative example.

Figure 9:
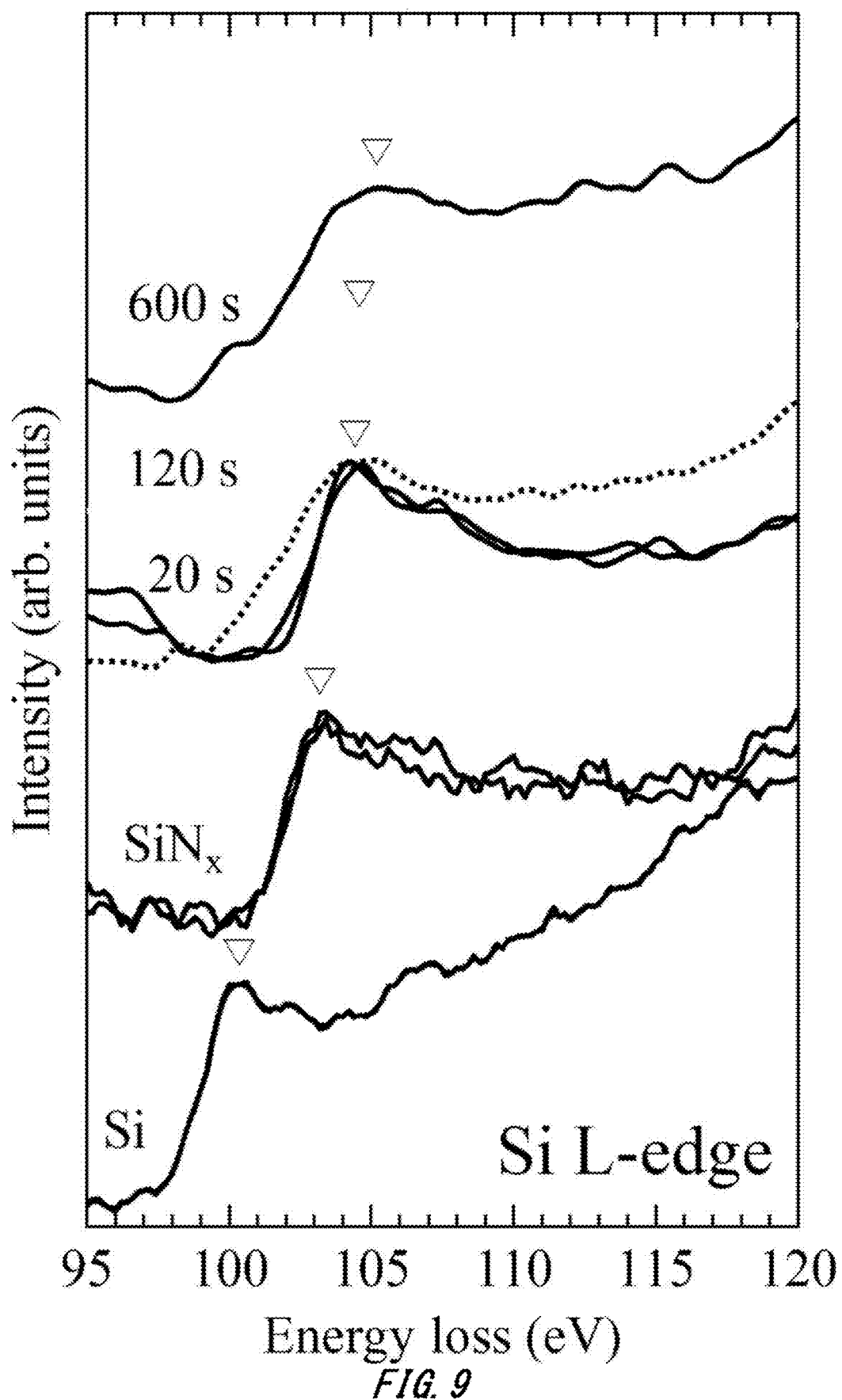
FIG. 9 shows a graph showing EELS measurement results of the SiAlN layer 120 respectively in the experimental examples 1 and 2 and the comparative example.

FIG. 9 is a graph showing the EELS measurement result of the SiAlN layer 120 in the experimental examples 1 and 2 and the comparative example. The EELS measurement results of the bulk Si crystal and the bulk SiNx crystal are also shown together for reference. The peak respectively shown by white blank triangles facing downward (∇) in FIG. 9 is the Si-atom L-edge peak. Since the Si-atom L-edge peak is different between the samples, it can be learned that a composition or an electron state for each sample is different.

Figure 10:
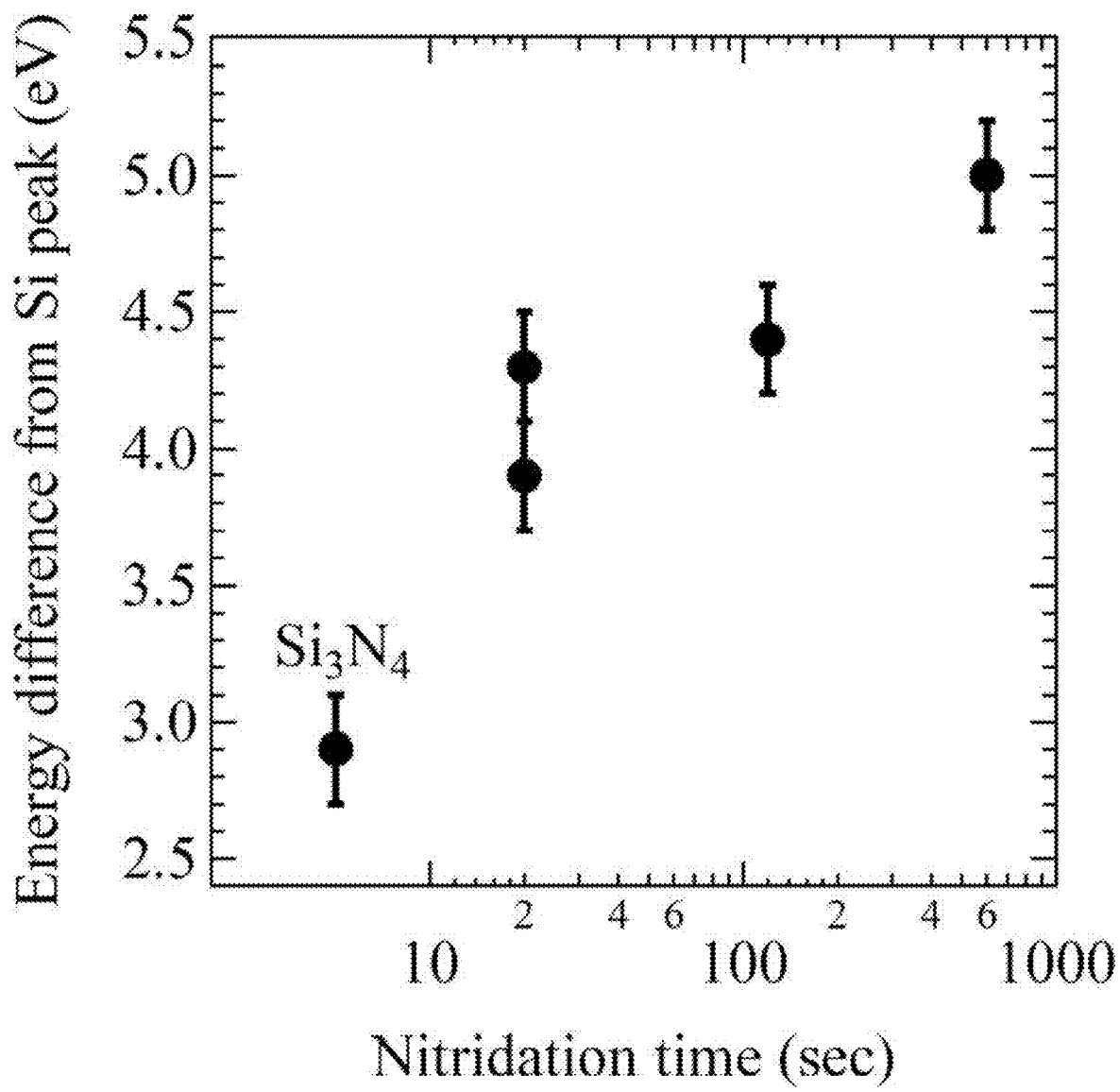
FIG. 10 shows a graph on which a difference ($\Delta E$) in the EELS energy loss from the bulk Si at a Si-atom L-edge peak to the time for the nitriding treatment is plotted.

FIG. 10 shows a graph on which a difference (ΔE) in the EELS energy loss at the Si-atom L-edge peak from the bulk Si relative to the time for the nitriding treatment is plotted. According to FIG. 10, it can be learned that ΔE of the experimental example 1 (20 s) and the experimental example 2 (120 s) that are non-defective products is within a range from 3.1 eV to 4.8 eV, and the warpage in the comparative example (600 s) or $Si_3N_4$ that deviate from the range is not acceptable. Accordingly, it can be said that the energy loss value of the SiAlN layer 120 at the Si-atom L-edge peak obtained by the EELS measurement is larger than that of a bulk Si by ΔE, where ΔE is preferably 3.1 eV or more and 4.8 eV or less.

EXPLANATION OF REFERENCES

100 . . . semiconductor wafer; 102 . . . silicon wafer; 104 . . . reaction suppressing layer; 106 . . . stress generating layer; 106a . . . first crystal layer; 106b . . . second crystal layer; 106c . . . first multilayered crystal layer; 108 . . . device forming layer; 110 . . . intermediate layer; 112 . . . active layer; 114 . . . Schottky layer; 120 . . . SiAlN layer

What is claimed is:

1. A semiconductor wafer comprising a silicon wafer, a reaction suppressing layer, a stress generating layer and an active layer, the silicon wafer, the reaction suppressing layer, the stress generating layer and the active layer being disposed in an order of the silicon wafer, the reaction suppressing layer, the stress generating layer and the active layer, wherein the reaction suppressing layer is a nitride crystal layer that suppresses a reaction between silicon atoms and group-III atoms, the stress generating layer is a nitride crystal layer that generates compressive stress, the active layer is a nitride crystal layer in which an electronic device is formed, the semiconductor wafer further has, between the silicon wafer and the reaction suppressing layer, a STAlN layer having silicon atoms, aluminum atoms and nitrogen atoms as main constituent atoms, the STAlN layer has a periodic structure, and the active layer includes a layer formed of $Al_pGa_{1-p}N$ (0≤p×0.1).

2. The semiconductor wafer according to claim 1, wherein a thickness of the STAlN layer is 1.8 nm or less.

3. The semiconductor wafer according to claim 1, wherein the SiAlN layer has a larger energy loss value at a Si-atom L-edge peak by ΔE than that of a bulk Si, the energy loss value obtained according to an EELS measurement, and the ΔE is 3.1 eV or more and 4.8 eV or less.

4. The semiconductor wafer according to claim 1, wherein the reaction suppressing layer is $Al_zGa_{1-z}N$ (0.9≤z≤1).

5. The semiconductor wafer according to claim 1, wherein the stress generating layer has any one of the following structures:

a first structure that is a first multilayered crystal layer including a first crystal layer in which a bulk crystal lattice constant is a1, and a second crystal layer in which a bulk crystal lattice constant is a2 (a1<a2);

a second structure that is a second multilayered crystal layer including the first crystal layer, the second crystal layer and a third crystal layer in which a bulk crystal lattice constant is a3 (a2<a3);

a third structure that is a graded crystal layer in which a bulk crystal lattice constant increases in a continuous or stepwise manner in a direction away from the silicon wafer; and a fourth structure that is a multilayered crystal layer in which a plurality of the first multilayered crystal layers, the second multilayered crystal layers or the graded crystal layers are repeatedly stacked.

6. The semiconductor wafer according to claim 5, wherein the stress generating layer is a first multilayered crystal layer including a first crystal layer in which a bulk crystal lattice constant is a1 and a second crystal layer in which a bulk crystal lattice constant is a2 (a1<a2), or is a multilayered crystal layer in which a plurality of the first multilayered crystal layers are repeatedly stacked, the first crystal layer is $Al_xGa_{1-x}N$ (0.9≤x≤1), and the second crystal layer is $Al_yGa_{1-y}N$ (0≤y≤0.3).

7. The semiconductor wafer according to claim 4, further comprising, between the reaction suppressing layer and the stress generating layer, an intermediate layer formed of $Al_qGa_{1-q}N$ (0≤q≤1, q<z).

8. The semiconductor wafer according to claim 7, wherein a thickness of the intermediate layer is 20 nm or more and 600 nm or less.

* * * * *